United States Patent [19]

Hinshaw

[11] Patent Number: 4,729,426
[45] Date of Patent: Mar. 8, 1988

[54] BONDED CLIP HEAT SINK

[75] Inventor: Howard G. Hinshaw, Dallas, Tex.

[73] Assignee: Thermalloy Incorporated, Dallas, Tex.

[21] Appl. No.: 836,816

[22] Filed: Mar. 6, 1986

[51] Int. Cl.$^4$ .......................................... H02L 23/40
[52] U.S. Cl. ............................. 165/80.3; 174/16 HS; 357/81; 165/185
[58] Field of Search ............................ 165/80.3, 185; 174/16 HS; 357/81

[56] References Cited

U.S. PATENT DOCUMENTS

| | | | |
|---|---|---|---|
| 3,548,927 | 12/1970 | Spurling | 174/16 HS |
| 4,054,901 | 10/1977 | Edwards et al. | 174/16 HS X |
| 4,215,361 | 7/1980 | McCarthy | 174/16 HS |
| 4,509,839 | 4/1983 | Lavochkin | 357/81 |
| 4,537,246 | 8/1985 | Lloyd | 357/81 X |
| 4,552,206 | 11/1985 | Johnson et al. | 165/185 X |

FOREIGN PATENT DOCUMENTS 2425723 12/1975 Fed. Rep. of Germany ... 174/16 HS

Primary Examiner—Albert W. Davis, Jr.
Assistant Examiner—Peggy Neils
Attorney, Agent, or Firm—Kanz, Scherback & Timmons

[57] ABSTRACT

A heat sink having a clip bonded thereon for resiliently securing the heat sink to an electronic device package. The clip includes an integral standoff directly bonded to the heat sink for spacing the clip from the heat sink. Preferably the heat sink and clip are surface treated before use.

11 Claims, 13 Drawing Figures

BONDED CLIP HEAT SINK

FIELD OF THE INVENTION

This invention relates generally to heat sinks. More particularly, it relates to heat sinks having bonded resilient clips for securing the heat sink to an electronic device package.

BACKGROUND OF THE INVENTION

Heat sinks are provided in conjunction with electronic device packages to conduct heat generated by the electronic device during use and to dissipate the heat to the environment so that the electronic device will not be damaged or its performance affected by the heat. Such electronic device packages include transistors, diodes, resistors and the like which are typically connected to a circuit through mounting on a printed circuit board. Generally, heat sinks are constructed of a material, usually a metal such as aluminum, having a high coefficient of thermal conduction and are formed into shapes adapted to convect or radiate heat at a high rate. In order for the heat sink to operate efficiently, it must be secured to and placed in good thermal contact with the electronic device package.

Various means are used to accomplish this purpose. For instance, it is known to provide an aperture in the electronic device package and to secure it to the heat sink by a screw, bolt or other mechanical means. However, this arrangement is somewhat time consuming. It may also be desirable to periodically or temporarily remove the heat sink, such as if the electronic device package to which the heat sink is secured is being replaced or repaired. For this purpose heat sinks have been developed having resilient spring clips which frictionally engage the electronic device package yet allow the heat sink to be quickly and easily attached or removed from the electronic device package. Such clips may be integrally formed with the heat sink or may be constructed separately and then bonded to the heat sink. It is to the latter type of heat sink that the present invention is directed.

It is also common and desirable to apply various surface treatments to the exterior of the heat sink and clip after assembly. Such surface treatments include, but are not limited to, anodization, electrodeposition, diffusion coating, galvanization, cladding, sprayed metal or paint coatings and conversion coatings as well as various forms of enamels, plastics, rubbers and vacuum deposited coatings. These treatments are beneficial in that they protect the heat sink and clip from corrosion caused by moisture or other materials in the environment. Although the heat sink and the clip may be surface treated separately before bonding, the bonding process tends to destroy the surface treatment beneath and adjacent the location of the bonding, exposing the unprotected material of the heat sink and permitting localized corrosion to occur. If the corrosion is severe enough, the effectiveness of the heat sink in transferring heat from the electronic device package may be reduced, the heat sink may be damaged or destroyed, or the integrity of the bonding of the clip to the heat sink may be reduced. In addition, certain of the surface treatments described above enable the heat sink to be selectively colored. Darker colors are desirable in that they enhance the ability of the heat sink to radiate heat to the atmosphere during use.

A conventional design for mounting the clip to the heat sink body is shown in FIGS. 1 and 2. Heat sink 10 includes flat middle body portion 12 with opposing flange portions 14 and 16, each having a C-shaped cross-section. Each of the flange portions also include a plurality of transverse slots 18 formed therein, which construction is known in the art to be effective in dissipating heat to the atmosphere through convection and radiation. Clip 20 includes attachment portion 22, concave middle portion 24 and lip 26. The attachment portion of the clip is bonded on the base of the heat sink at location 28 such as by spot welding or ultrasonic bonding. The clip is adapted to resiliently grip an electronic device package inserted into the gap between the concave portion of the clip and the base portion of the heat sink, guided by the lip.

Although the attachment portion of the clip is intended to present a flat parallel surface to the base portion of the heat sink for bonding purposes, there are inevitably irregularities and deformations in the attachment portion of the clip. Further, similar irregularities and deformations are commonly found in base portion of the heat sink. Therefore, the various surface irregularities and deformations create random gaps therebetween of varying thickness and area, as illustrated at 30 in FIG. 2, or areas of contact when the clip is bonded on the heat sink. This has the undesirable effect that when the heat sink and clip are surface treated after assembly, portions of the opposing surfaces on each part may not be accessible and thus not effectively treated. Most surface treatment processes require that the surfaces to be treated be prepared by removing all oils, greases, dirt, dust, metal cuttings, oxide scales, cutting or grinding fluids or other contaminants. The surface is then cleaned again with a solvent and etched with an acid such as sulfuric acid or hydrochloric acid. Finally, the surfaces are sealed beneath a protective layer to shield them from corrosive elements. For instance, if aluminum is being anodized, a layer of aluminum oxide is created by an electropheresis process. If the surfaces are not adequately prepared, the surface treatment will not be completely effective and subsequent exposure of the heat sink to a harsh environment may induce corrosion on the exposed surfaces. Further, the bonding between the heat sink and the clip may not be complete or be adversely affected by subsequent corrosion, thus reducing the reliability with which the heat sink is secured to the electronic device package. It is thus desirable to construct a heat sink with a clip which is securely bonded on the heat sink, but in which all exposed surfaces are accessible after assembly for surface treatment.

SUMMARY OF THE INVENTION

The present invention provides a heat sink having a clip bonded thereon and also provides a clip adapted for mounting on a heat sink. The clip includes an integrally formed standoff which is bonded directly to the heat sink body. The remainder of the clip adjacent the heat sink is spaced from the heat sink by a predetermined distance so that effective penetration of any subsequent surface treatment is assured. Further, the clip is more securely bonded to the heat sink.

In alternate embodiments of the invention the clip may be provided with various flanges or tangs for positioning and guiding the heat sink and clip with respect to the electronic device package to which the heat sink is secured.

Therefore, it is a principal feature and advantage of this invention to provide an improved bonded clip heat sink.

It is another feature and advantage of this invention to provide an improved bonded clip heat sink in which all exposed heat sink and clip surfaces are accessible for surface treatment.

It is yet another feature and advantage of this invention to provide an improved bonded clip heat sink having one or more flanges for positioning and guiding the heat sink with respect to an electronic device package.

It is another feature and advantage of this invention to provide an improved bonded clip heat sink in which the clip is securely bonded to the heat sink.

BRIEF DESCRIPTION OF THE DRAWINGS

So that the manner in which the above recited features and advantages of the invention, as well as others which will become apparent to those skilled in the art, are obtained and can be understood in detail, a more particular description of the invention briefly summarized above may be had by reference to the embodiments thereof which are illustrated in the accompanying drawings, which drawings form a part of the specification and in which like numerals depict like parts in the several views. It is noted, however, that the appended drawings illustrate only a preferred embodiment of the invention and are therefore not to be considered limiting of its scope, for the invention may admit to other equally effective embodiments.

DETAILED DESCRIPTION OF THE INVENTION

Figure 2:
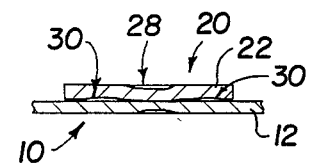
FIG. 2 is a cross-sectional view along plane 2—2 of the heat sink and clip of FIG. 1.
Figure 1:
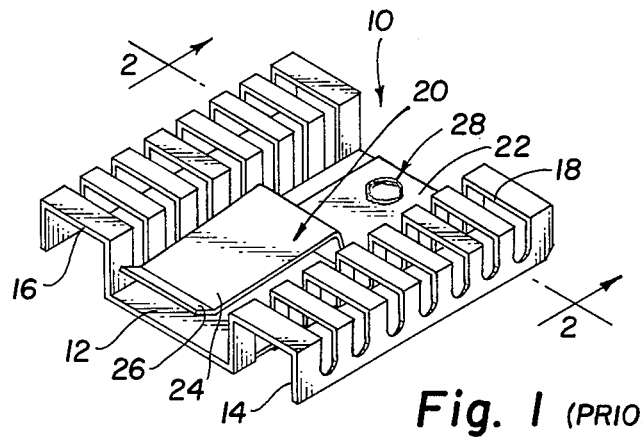
FIG. 1 is a perspective view of a prior art heat sink including a clip bonded thereon.
Figure 4:
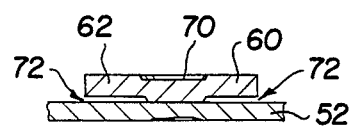
FIG. 4 is a cross-sectional view along plane 4—4 of the heat sink and clip of FIG. 3.
Figure 3:
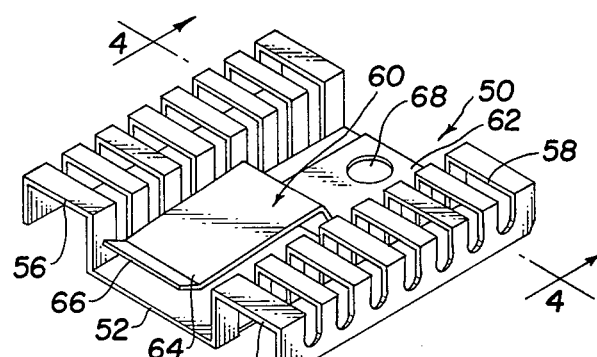
FIG. 3 is a perspective view of a heat sink including a clip bonded thereon according to the present invention.
Figure 5:
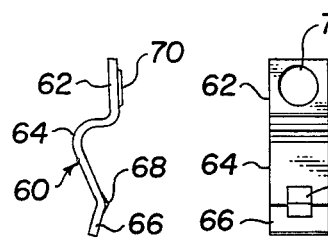
FIG. 5 is a side view of the clip of FIG. 3.
Figure 6:
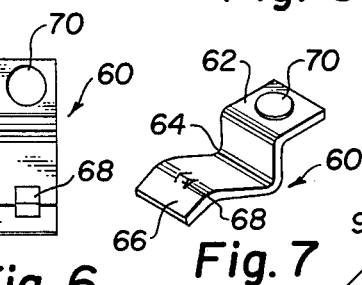
FIG. 6 is a top view of the clip of FIG. 5.

Referring now to FIGS. 3 and 4, the reference numeral 50 generally indicates a heat sink constructed according to the present invention. The heat sink includes base portion 52 with opposing flange portions 54 and 56, each having a C-shaped cross-section. Each of the flange portions also includes a plurality of transverse slots 58 formed therein, which construction is known in the art to be effective in dissipating heat to the atmosphere through convection and radiation. Clip 60 is bonded to the base portion of the heat sink and includes attachment portion 62, concave middle portion 64 and lip 66, all also shown in detail in FIGS. 5, 6 and 7. The clip may be constructed of any suitable resilient material but is preferably constructed of the same material as the heat sink in order to assist in the conduction of heat from the electronic device package and to ensure effective bonding between the clip and the heat sink.

As in conventional heat sinks with bonded clips, the heat sink is secured to an electronic device package by inserting the electronic device package between the clip and the base portion of the heat sink, guided by the lip on the clip. The electronic device package is contacted by the clip at the juncture of the concave middle portion and the lip so as to be resiliently urged into contact with the base portion of the heat sink and is thus securely engaged therewith. The clip may also include ridge 68 at the aforementioned juncture of the concave middle portion and lip. The ridge concentrates the force applied to the electronic device package urging it toward the heat sink so as to more effectively grip the surface of the electronic device package and to prevent relative longitudinal movement between the heat sink and the electronic device package.

Standoff 70 is formed in end portion 62 and constitutes a circular detent depending downwardly from the clip. Preferably the clip is integrally formed with the standoff and ridge as shown in FIGS. 3-7 such as by stamping a suitably sized piece of sheet metal. The clip is bonded to the heat sink at the standoff such as by spot welding or ultrasonic bonding or by any other conventional manner known in the art. As is shown particularly in FIG. 4 the standoff spaces the remainder of the attachment portion of the clip above the heat sink so as to create a gap (as illustrated at 72) of a predetermined distance therebetween. This gap is sufficiently large so as to enable all exposed surfaces of the clip and the heat sink, including the opposing surfaces of the attachment portion of the clip and the base portion of the heat sink, to be surface treated as desired. Minor irregularities or deformations in the heat sink or the clip will be insufficient to obstruct access to these surfaces. Further, standoff 70 ensures more effective bonding of the clip to the heat sink, as compared to conventional designs, since it is the only area of contact between the clip and the heat sink.

Figures 7, 8, 9, 10:
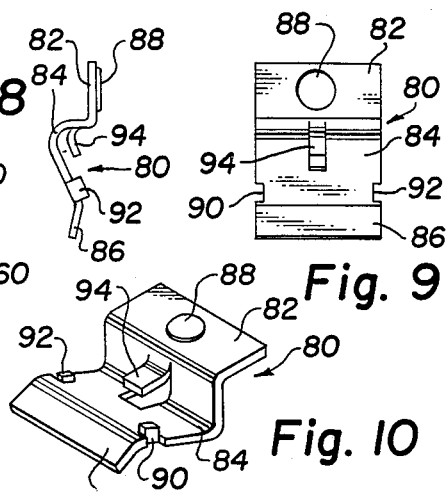
FIG. 7 is a perspective view of the clip of FIG. 5.
FIG. 8 is a side view of an alternative embodiment of a clip according to this invention.
FIG. 9 is a top view of the alternate clip of FIG. 8.
FIG. 10 is a perspective view of the alternate clip of FIG. 8.

FIGS. 8, 9 and 10 illustrate an alternate embodiment 80 of the clip of this invention in which the clip includes attachment portion 82, concave middle portion 84 and lip 86 as in the embodiment of FIGS. 3-7. The clip similarly includes standoff 88 formed in the attachment portion thereof. The clip is bonded to the heat sink as in FIGS. 3-7 using the standoff to space the remainder of the clip a predetermined distance from the heat sink and permitting surface treatment of all exposed surfaces. However, clip 80 is constructed of a width at least as large as the width of the electronic device package with which the heat sink is to be used and further includes upwardly extending side flanges 90 and 92 along opposite edges of the concave middle portion thereof.

The side flanges are constructed and positioned for sliding engagement with the sides of the electronic device package (not shown) as it is inserted between the heat sink and the clip. The side flanges thus position the electronic device package with respect to the clip and the heat sink while the heat sink is secured on the electronic device package. Tang 94 is also formed on the concave middle portion of the clip at the juncture with the attachment portion. The tang extends toward the electronic device package intermediate the side flanges so as to contact the uppermost edge of the electronic device package when the heat sink is secured thereto. The tang cooperates with the side flanges in positioning the electronic device package with respect to the heat sink and clip by limiting the insertion of the electronic device package. Preferably, the side flanges and tang are integrally constructed with the clip such as by stamping or by any other method known to the art.

Figure 11:
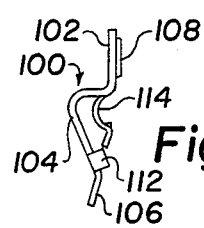
FIG. 11 is a side view of another alternative embodiment of a clip according to this invention.
Figure 12:
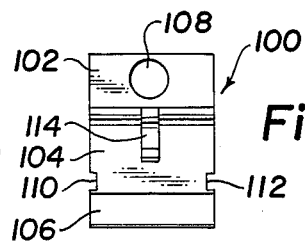
FIG. 12 is a top view of the alternate clip of FIG. 11.
Figure 13:
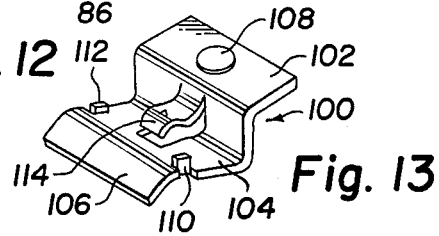
FIG. 13 is a perspective view of the alternate clip of FIG. 11.

FIGS. 11, 12 and 13 illustrate yet another alternate embodiment 100 of the clip of this invention. In this embodiment the clip includes attachment portion 102, concave middle portion 104 and lip 106. Standoff 108 is integrally formed in the attachment portion of the clip and is used to bond the clip to the heat sink and space it therefrom as in the previous embodiments. Clip 100 also includes upwardly extending side flanges 110 and 112, as in the embodiment of FIGS. 8-10, to engage the sides of the electronic device package when the heat sink is secured thereon. The clip of FIGS. 11-13 further includes tang 114 which extends toward the electronic device package when the heat sink is secured thereon. Tang 114 is not intended to contact the edge of the electronic device package. Rather, tang 114 has an undulating or s-shaped profile. The clip is intended for use with electronic device packages such as the Jedec TO-220 package and others having an aperture in the thermal transfer plate adapted for use with a screw or bolt to mount the electronic device package to a heat sink or otherwise as previously discussed. In the present invention tang 114 registers in this aperture to locate the electronic device package with respect to the heat sink and the clip and to prevent relative longitudinal movement therebetween. In all other respects this embodiment of the invention functions as previously described herein. Preferably, the side flanges and the tang are integrally formed with the clip.

Although the invention has been described herein with regard to particular and preferred embodiments, these are advanced for illustrative purposes only and are not intended to limit the scope of this invention. For instance, it is within the scope of this invention to provide a clip having more than one standoff formed therein or a standoff which is not circular in shape. It is to be understood, therefore, that although the invention has been described with particular reference to specific embodiments thereof, the forms of the invention shown and described in detail are to be taken as preferred embodiments of same, and that various changes and modifications may be resorted to without departing from the spirit and scope of the invention as defined by the appended claims.

What is claimed is:

1. A heat sink for use in dissipating heat from an electronic device package comprising:
   (a) a body constructed of heat conducting material and adapted for rapid dissipation of heat therefrom;
   (b) a clip constructed of resilient material bonded to said heat sink body and adapted to grip an electronic device package to secure the electonic device package to said heat sink body and in thermal contact therewith, said clip having a first portion including an integral standoff formed thereon which is bonded to said body and spaces said first portion of said clip from said body.

2. A heat sink as defined in claim 1 wherein said clip includes a pair of side flanges adapted for sliding contact with opposing sides of the electronic device package.

3. A heat sink as defined in claim 2 wherein said clip includes a tang adapted to contact the electronic device package at the end thereof furthest inserted between said clip and said heat sink body.

4. A heat sink as defined in claim 2 wherein said clip includes a tang adapted to engage an aperture in the electronic device package and prevent relative longitudinal movement between the device package and the heat sink.

5. A heat sink as defined in claim 1 wherein said body and said clip are surface treated.

6. A clip for securing an electronic device package in thermal contact with a heat sink comprising:
   (a) an elongated body of resilient material having a first end and a second end;
   (b) an integral standoff formed in said first end adapted to be bonded to said heat sink and to space the remainder of said body from the surface of said heat sink.

7. A clip as defined in claim 6 wherein said clip is surface treated.

8. A clip as defined in claim 6 including a pair of side flanges adapted for sliding contact with opposing sides of an electronic device package.

9. A clip as defined in claim 8 including a tang for contact with an electronic device package inserted between said clip and a heat sink.

10. A clip as defined in claim 8 including a tang adapted to engage an aperture in an electronic device package inserted between said clip and a heat sink to prevent relative longitudinal movement between the device package and the heat sink.

11. A heat sink for use in dissipating heat from an electronic device package comprising:
    (a) a body constructed of heat conducting material and adapted for rapid dissipation of heat therefrom;
    (b) a clip adapted to be affixed to said body and to secure an electronic device package adjacent the surface of said body constructed of resilient material, said clip having a first portion defining an integral standoff with the face thereof bonded to said body and supporting the remainder of said clip spaced from said body.

* * * * *